United States Patent [19]

Gheewala

[11] 4,313,066

[45] Jan. 26, 1982

[54] DIRECT COUPLED NONLINEAR INJECTION JOSEPHSON LOGIC CIRCUITS

[75] Inventor: Tushar R. Gheewala, Yorktown Heights, N.Y.

[73] Assignee: International Business Machines Corporation, Armonk, N.Y.

[21] Appl. No.: 68,299

[22] Filed: Aug. 20, 1979

[51] Int. Cl.³ .................... H03K 19/195; H03K 19/20
[52] U.S. Cl. ...................................... 307/462; 307/277; 307/306
[58] Field of Search ............... 307/212, 218, 306, 277, 307/462

[56] References Cited

U.S. PATENT DOCUMENTS

| | | | |
|---|---|---|---|
| 3,953,749 | 4/1976 | Baechtold et al. | 307/277 |
| 4,051,393 | 9/1977 | Fulton | 307/212 |
| 4,117,354 | 9/1978 | Geewala | 307/306 |

FOREIGN PATENT DOCUMENTS 2810649 1/1979 Fed. Rep. of Germany.
2735133 2/1979 Fed. Rep. of Germany.

OTHER PUBLICATIONS

T. A. Fulton et al., A Simple High-Performance Current-Switched Josephson Gate, Applied Physics Letters, May 15, 1979, pp. 709-711.
T. R. Gheewala, Josephson Logic Circuits Based on Nonliner Current Injection in Interferometer Devices, Oct. 15, 1978, pp. 781-783.
IBM Technical Disclosure Bulletin, vol. 22, No. 7, 12/79, T. R. Gheewala, "Parallel-Connected Current Injection OR Gate for Joephson Technology".
Bulletin ASE/UCS, Band 68, Nr. 2, Jan. 1977, pp. 66-70, P. Wolf, "Josephson-Kontakte in der Digitaltechnik".
Radio Fernsehen Elektronik, Band 24, Nr. 17, 1975, W. D. Schmidt, pp. 549-552, "Kryoelektronische Bauelemente fur die Digitaltechnik."
A Josephson Logic Design Employing Current-Switched Junctions, T. A. Fulton et al., IEEE Trans. on Magnetics, MAG-13, No. 1, Jan. 1977, pp. 1-3.

Primary Examiner—John Zazworsky
Attorney, Agent, or Firm—Jackson E. Stanland

[57] ABSTRACT

Direct coupled, nonlinear injection logic circuits having high gain, good isolation between input and output, the capability of parallel fan-in and fan-out, and which do not require a large area. These circuits are comprised of a first stage that isolates the input from the output and other stages which can be used for additional gain, or for building logic circits, such as AND, and DOT-OR. The first stage isolation is a parallel network comprised of two circuits, each circuit of which includes a series connection of resistor-Josephson tunnelling device. A gate current $I_g$ flows through each Josephson device when the devices are in their zero voltage states. An input current $I_c$ is injected into one of the parallel circuits while an output is taken from the other parallel circuit. When an input current is injected, one of the Josephson devices is switched to the nonzero voltage state, which then causes a greater amount of gate current $I_g$ to be switched to the other Josephson device, thereby also switching it to the nonzero voltage state. The gate current is then delivered to a load, or used as an input to other stages of a logic circuit. Complete isolation between input and output is achieved by the two Josephson devices in their nonzero voltage states.

12 Claims, 8 Drawing Figures

4,313,066

DIRECT COUPLED NONLINEAR INJECTION JOSEPHSON LOGIC CIRCUITS

DESCRIPTION

1. Technical Field

This invention relates generally to Josephson tunnelling device circuits, and more particularly to improved logic circuits using Josephson devices.

2. Background Art

Logic circuits using Josephson tunnelling devices are generally known in the art, as can be seen by referring to U.S. Pat. No. 4,117,354, assigned to the present assignee and filed in the name of T. R. Gheewala, and to a related publication of T. R. Gheewala which appeared on Page 781 of Applied Physics Letters 33, 8, Oct. 15, 1978. In these logic circuits, Josephson interferometers are switched by direct injection of current into the interferometer or by electromagnetic coupling of an input current in an overlying control line to the interferometer circuit. Both linear and nonlinear injection modes of switching interferometers are described in the aforementioned Applied Physics Letters article.

The use of control currents in overlying control lines has several disadvantages when logic circuits are being designed. One disadvantage is that large areas are required for the fabrication of such circuits, while another disadvantage is that these circuits have resonances which must be damped in order to have high speed operation. Additionally, such circuits are susceptible to trapped flux in the ground plane and may exhibit switching due to this trapped flux. Accordingly, magnetic shielding is required. Still another disadvantage is that inductive coupling can occur between the overlying control line and the superconducting loop containing at least one Josephson device. Because of this inductive coupling, total isolation between the input and the output of the logic circuit is not possible. This inductive coupling problem becomes worse as the dimensions of the Josephson tunnelling devices and circuits become smaller.

While the logic circuits described in the aforementioned Gheewala patent and technical article provide good gain, such circuits do not provide an extremely high degree of isolation between the input and the output of the circuits. Accordingly, it is a primary object of the present invention to provide Josephson tunnelling device circuits for logic applications, which provide good isolation between input and output terminals, and which can be used to provide high gains.

It is another object of the present invention to provide an improved Josephson tunnelling device circuit useful for logic applications, in which the input signal is directly coupled to the Josephson device circuitry, and which does not require a large area.

It is another object of the present invention to provide a very fast logic circuit using Josephson tunnelling devices, which can be adapted for DOT-OR and parallel fan-out.

It is another object of the present invention to provide Josephson device logic circuits using direct injection of input signals, which can be used to provide AND circuits and DOT-OR circuits.

It is another object of the present invention to provide an improved Josephson tunnelling device logic circuit using a direct coupled isolation gate comprising a plurality of Josephson tunnelling devices, but which requires only one gate current supply.

DISCLOSURE OF THE INVENTION

An improved Josephson tunnelling device logic circuit is described which provides exceptionally good isolation between the input and the output, and which can be used to provide different logical functions. The input control signal is directly injected into a parallel network of two circuits, each circuit of which includes a series connection of a resistor and a Josephson tunnelling device. A gate current $I_g$ flows through each Josephson tunnelling device when the Josephson devices are in their zero voltage state. An input connection is made to a midpoint of one of the two circuits in the parallel network for direct injection of an input current $I_c$. An output is taken from a midpoint of the other circuit comprising the series connection of a Josephson tunnelling device and a resistor.

When both Josephson devices are in their zero voltage state, a gate current $I_g$ divides and flows through both of the Josephson devices. When the Josephson devices are in the zero voltage state, an injected input current $I_c$ also flows through both of the Josephson tunnelling devices. However, the direction of $I_c$ is opposite to the direction of $I_g$ in one of the Josephson devices, but in the same direction as $I_g$ in the other Josephson device. In the Josephson device in which $I_c$ and $I_g$ are in the same direction, the presence of current $I_c$ switches that Josephson device, which in turn causes almost the entire gate current $I_g$ to travel through the other Josephson device. This switches that other Josephson device to a nonzero voltage state which in turn introduces a relatively large resistance into the isolation gate. This steers the gate current $I_g$ to a load or to another stage in a logical circuit.

Since the directions of currents $I_c$ and $I_g$ are opposite in one of the Josephson devices, a large input current $I_c$ can be applied to this circuit in order to ensure switching of the other Josephson device. This is a distinct advantage of the present circuit, since the Josephson devices can be designed to ensure switching when the input signal is applied. Further, reliability of switching is obtained even though only one power supply is required for provision of gate current $I_g$. It is not necessary to use another current source to supply gate current simultaneously to both Josephson devices when both are in their zero voltage states.

Several stages of the parallel network described above can be linked together with the output of one as the input to the next stage, in order to provide increased gain (defined as the amount of gate current which can be switched by an input control signal $I_c$). Additionally, a different type of stage (such as that shown in FIG. 6) can be used with the isolation gate of FIG. 1 to provide gain.

Since the direct coupled isolation gate comprising the aforementioned parallel network is not comprised of magnetically coupled Josephson interferometers, a DOT-OR network can be used to inject a plurality of signals into the isolation gate. Thus, the output of the isolation gate will indicate the presence of any of a plurality of input signals, in order to realize the OR function. These isolation gate stages can be used in combination to provide the AND function.

These and other objects, features, and advantages will be more apparent from the following more particular description of the preferred embodiments.

BRIEF DESCRIPTION OF THE DRAWINGS

In FIG. 2, both Josephson devices are in their zero voltage state, while in FIG. 3 one of the Josephson devices (J2) has switched to its nonzero voltage state.

BEST MODE FOR CARRYING OUT THE INVENTION

Isolation Gate (FIGS. 1, 2, 3, 4, and 5)

Figure 1:
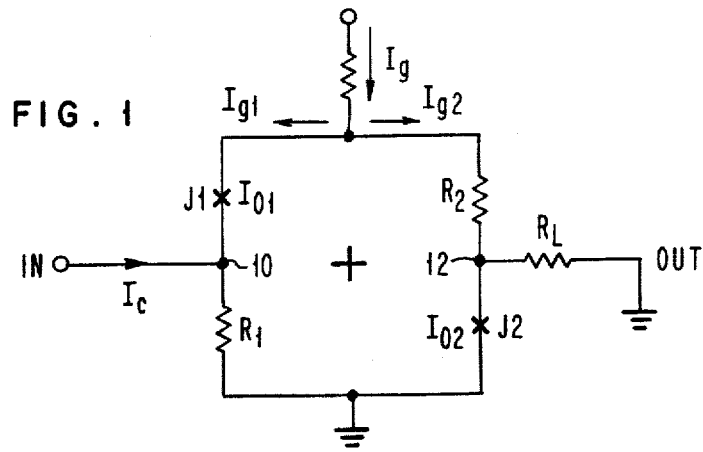
FIG. 1 is a schematic illustration of a direct coupled isolation gate comprising two Josephson tunnelling devices, which is the basic building block of logic circuits in accordance with this invention.

A schematic diagram of the Josephson tunnelling device isolation gate is shown in FIG. 1. The gate is comprised of two Josephson tunnelling devices J1 and J2, and two resistances $R_1$ and $R_2$. This is a parallel network having two series connected circuits, the first of which comprises the Josephson device J1 and the resistance $R_1$, while the second is comprised of Josephson device J2 and resistance $R_2$. This parallel network can be comprised of well known materials, including the lead-base alloys described by J. H. Greiner et al, J. Vac. Sci. Technol. 11, 81 (1974).

A source (not shown) provides gate current $I_g$ through the Josephson devices J1 and J2. An input current $I_c$ is provided to node 10 along one of the series circuits, while an output is connected to node 12 along the other of the series circuits. A load resistor $R_L$ is connected to circuit node 12.

Gate current $I_g$ splits into two portions $I_{g1}$ and $I_{g2}$. As will be seen, when both Josephson devices J1 and J2 are in their nonzero voltage states, the total gate current $I_g$ is switched to the output load $R_L$, and none passes back to the input circuit along which $I_c$ flows.

Figure 2:
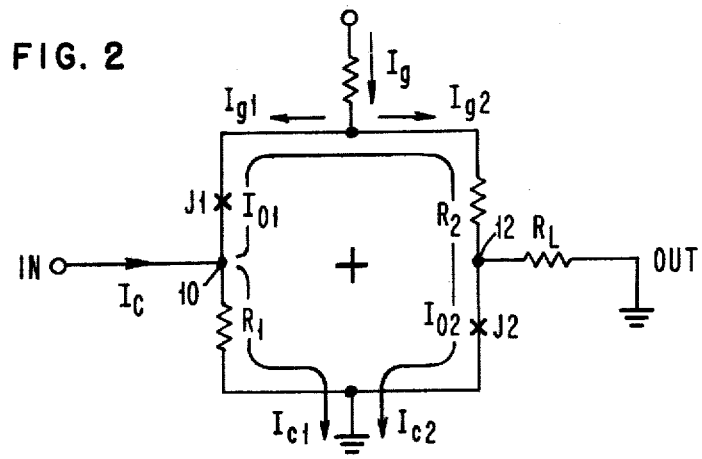
FIGS. 2 and 3 illustrate the flow of an input control current $I_c$, depending upon the state of the Josephson devices in the circuit of FIG. 1.

FIG. 2 illustrates the operation of the isolation gate of FIG. 1 when both Josephson devices J1 and J2 are in their zero voltage states. As is well known in the art, Josephson devices can be switched between a zero voltage state and a high resistance nonzero voltage state. In FIG. 2, the Josephson devices are in their zero voltage state and the currents $I_{g1}$ and $I_{g2}$ are inversely proportional to $R_1$ and $R_2$.

FIG. 2 also shows the splitting of input control current $I_c$ into two parts $I_{c1}$ and $I_{c2}$. As is apparent from this figure, currents $I_{c2}$ and $I_{g2}$ flow in the same direction through Josephson device J2, while currents $I_{c2}$ and $I_{g1}$ flow in opposite directions through Josephson device J1. Still further, a gate current $I_g$ flows into both Josephson devices when they are in their zero voltage states, rather than flowing through only one of the Josephson devices. As will be more fully apparent later on, these factors provide circuit advantages.

The operating characteristic of the circuit of FIG. 1 is such that the presence of input current $I_c$ will produce a control current $I_{c2}$ through device J2. This will cause device J2 to switch to its nonzero voltage state, which will send most of the gate current $I_g$ through Josephson device J1 (actually, a very small amount of gate current will flow through $R_2$ and the load resistor $R_L$). Device J1 has a threshold characteristic such that the increased amount of gate current therethrough will cause device J1 to also switch to its nonzero voltage state. When this occurs, all of the gate current will be sent through $R_2$ and into the load resistor $R_L$.

Figure 3:
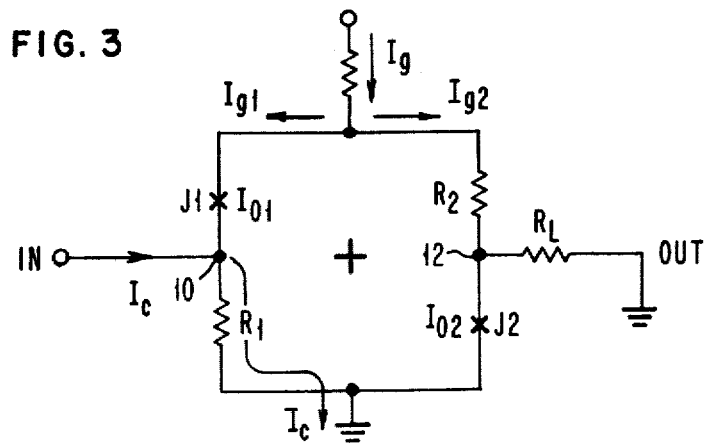

The situation when J2 has switched to its nonzero voltage state is illustrated in FIG. 3. Current $I_{g1}$ is much larger than current $I_{g2}$, and causes Josephson device J1 to switch into its nonzero voltage state. Since J2 is in its nonzero voltage state, and since $R_1$ is much less than $R_L$, most of the control current $I_c$ flows through $R_1$ to ground, as illustrated in FIG. 3.

After device J1 switches to its nonzero voltage state, all of the gate current $I_g$ flows through $R_2$ and load resistance $R_L$. None of the gate current can flow back to the input circuit along which current $I_c$ was injected into the isolation gate, because both J1 and J2 have been switched. Devices J1 and J2 can be reset to their zero voltage states by decreasing the magnitude of $I_g$. (In operation, an alternating gate current is applied.)

Figure 4:
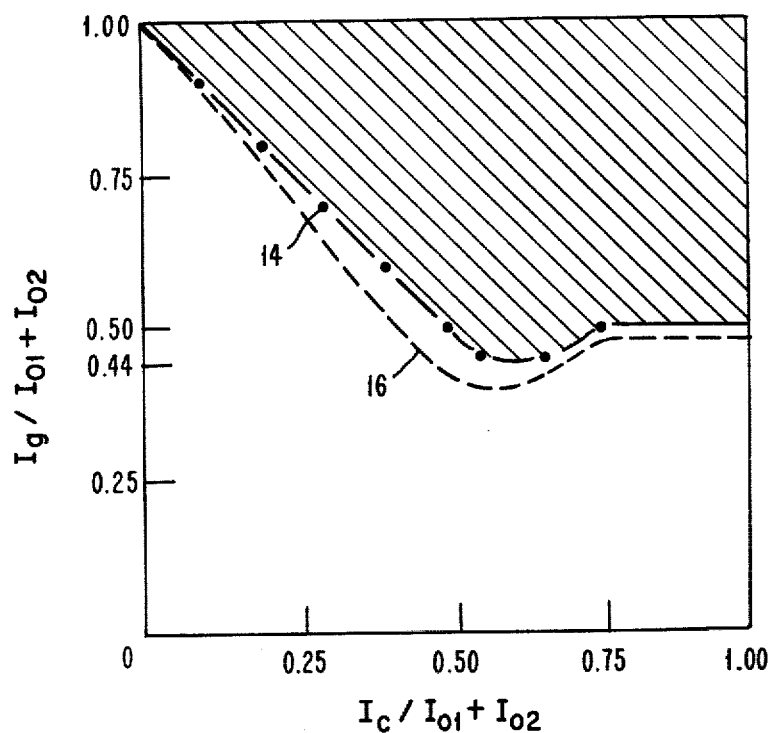
FIG. 4 is a threshold curve of the isolation gate of FIG. 1, showing the switching characteristic of the gate of FIG. 1.

FIG. 4 is the gain curve for the circuit of FIG. 1. This curve plots the maximum gate current $I_g$ that can be used while maintaining the isolation gate in the superconducting state for any control current $I_c$. The maximum gate current and the control current are normalized to the sum of the maximum gate currents that can be passed through Josephson devices J1 and J2 for zero control current $I_c$. Thus, in FIG. 1, the maximum gate current that Josephson device J1 can pass without switching when $I_c=0$ is $I_{01}$, while the maximum Josephson tunnelling current through device J2 when $I_c=0$ is $I_{02}$.

In FIG. 4, the parallel network of FIG. 1 remains superconducting for values of gate current $I_g$ and control current $I_c$ which will yield operating points below the cross-hatched region of the plot while, for values of gate current $I_g$ and control current $I_c$ yielding operating points in the cross-hatched region, the circuit will be in its nonzero voltage state. The top curve 14 is produced by application of a very slow rise time input signal $I_c$, while the bottom curve 16 is produced by application of current input $I_c$ having a reasonably sharp rise time (for example, 100 pico-seconds).

In order to obtain maximum efficiency of device switching and to have maximum isolation between the input and the output, the following design rules are followed.

$$I_{01}R_1 = I_{02}R_2 \qquad \qquad 1.$$

$$\frac{R_1}{R_1 + R_2} I_c + I_{g2} > I_{02} \qquad \qquad 2.$$

$$\frac{R_2 + R_L}{R_1 + R_2 + R_L} I_g - \frac{R_1}{R_1 + R_2 + R_L} I_c > I_{01} \qquad 3.$$

Design Rule 1 makes the maximum gate current $I_g$ equal to the sum of critical currents $I_{01}$ and $I_{02}$. The second design rule ensures that $I_{g2}$ and $I_{c2}$ are sufficient to switch J2. That is, this design rule sets the condition for the gate current such that the onset of a control current $I_c$ will always switch J2. Design Rule 3 ensures that the gate current $I_{g1}$ sent back into J1 when J2 has switched is sufficient to switch device J1. Thus, these three design rules ensure maximum switching reliability for both Josephson devices when the input $I_c$ is applied.

As was previously noted, only a single source of gate current is required, even though two Josephson devices are used in this circuit. Since J1 has gate current $I_{g1}$ flowing through it even when J2 is in its zero voltage state, and since $I_{c2}$ flows in an opposite direction through J1 than $I_{g1}$, a very large input $I_c$ can be used to ensure switching of J2.

In the circuit of FIG. 1, the node 12 is located between $R_2$ and J2. This means that, when both J1 and J2 are in their zero voltage state, no gate current will pass into load resistance $R_L$.

Figure 5:
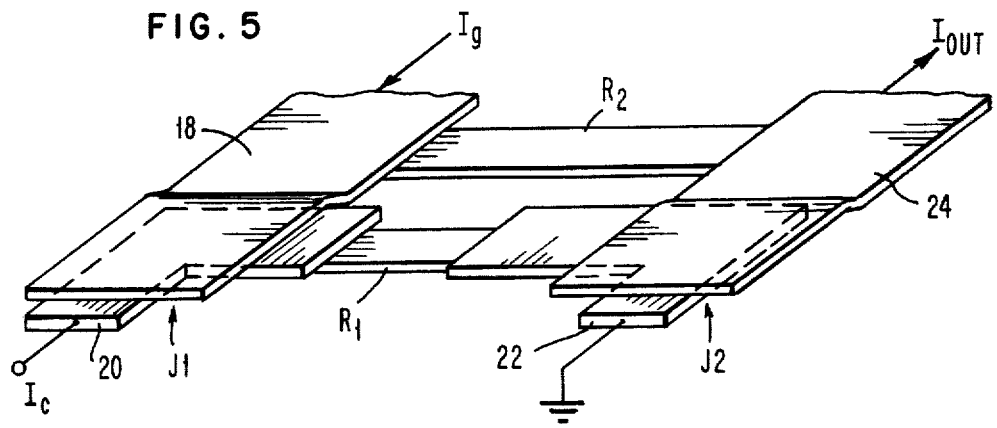
FIG. 5 is a schematic illustration of a physical layout for implementing the isolation gate of FIG. 1.

FIG. 5 shows a structural layout for the isolation gate of FIG. 1. In this drawing, Josephson device J1 is comprised of a superconducting counter electrode 18 and a superconducting base electrode 20. A tunnel barrier is located between electrodes 18 and 20 and is sufficiently thin to allow Josephson tunnelling current therethrough.

The resistor $R_1$ is electrically connected to base electrode 20 and to base electrode 22 of Josephson tunnelling device J2. A thin tunnel barrier is located between base electrode 22 and counter electrode 24 of Josephson device J2. Resistor $R_2$ is electrically connected to electrodes 18 and 24. Gate current $I_g$ flows into superconductive electrode 18, while input control current $I_c$ flows into superconducting electrode 20. An output is taken from superconducting electrode 24.

The circuit of FIG. 5 is easily fabricated using sequential deposition of appropriate superconducting materials, such as lead based alloys and/or niobium. The aforementioned reference to Greiner et al describes a suitable process for the fabrication of this circuit, and for the fabrication of other Josephson circuits.

Figure 6:
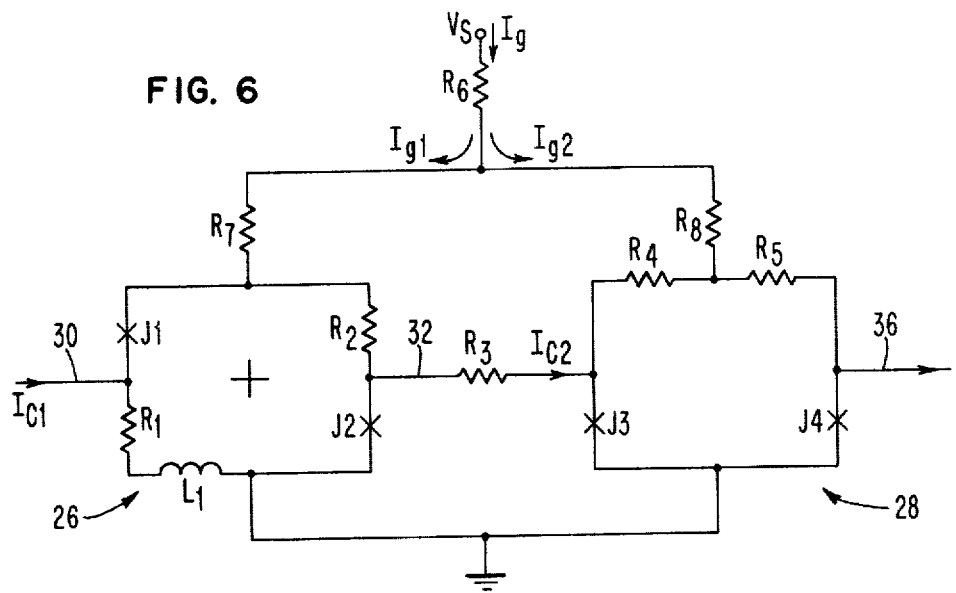
FIG. 6 is a schematic diagram of a circuit using an isolation gate in combination with a Josephson device gain stage in order to provide increased gain.

High Gain Circuits (FIG. 6)

The circuit of FIG. 6 is comprised of an isolation gate stage 26 and a gain stage 28, which could be another isolation gate, such as gate 26. These stages are fed by a common gate current $I_g$ which divides into two portions $I_{g1}$ and $I_{g2}$. The output of stage 26 is the input $I_{c2}$ to the second stage 28.

In more detail, isolation gate 26 is comprised of Josephson tunnelling devices J1 and J2, as well as resistances $R_1$ and $R_2$. An input current $I_{c1}$ is applied along line 30, and an output will appear along transmission line 32 when both J1 and J2 are in their non-zero voltage states. Resistor $R_3$ is a current limiting resistor connected in transmission line 32. The inductance $L_1$ in gate 26 balances the inductance of the superconducting loop comprising J1 and J2, and therefore speeds the switching of J1 and J2.

Stage 28 is comprised of two Josephson tunnelling devices J3 and J4, as well as the resistors $R_4$ and $R_5$. A current limiting resistor $R_6$ is connected to the gate current source (not shown) and resistors $R_7$ and $R_8$ are connected in the gate current input lines to stages 26 and 28, respectively.

Isolation gate 26 operates identically to the operation of the isolation gate shown in FIG. 1. That is, when a current $I_{c1}$ is present, device J2 switches to its nonzero voltage state and most of the gate current then flows through J1, causing it to switch to its nonzero voltage state. When both J1 and J2 are switched, current $I_{g1}$ will be directed to output transmission line 32 and then to stage 28.

Gain stage 28 operates in a manner different than isolation gate 26. That is, when current $I_{c2}$ is present, Josephson device J3 switches to its nonzero voltage state causing an increased gate current through Josephson device J4. This increased gate current together with $I_{c2}$, switches J4 to its nonzero voltage state. This delivers current $I_g = I_{g1} + I_{g2}$ to the output along transmission line 36.

In the circuit of FIG. 6, the total output current is proportional to the sum of $I_{g1}$ and $I_{g2}$. Thus, for a given input current $I_{c1}$, a larger output is achieved. Many stages can be used to increase the gain of the overall circuit in accordance with the principles described with respect to FIG. 6.

In FIG. 6, the gain stage is a different circuit than the isolation gate of FIG. 1. However, the gain stage could be another isolation gate, in tandem with isolation gate 26 (i.e., gain stage 28 could be replaced by another isolation gate 26).

Representative values for the circuit parameters of FIG. 6 are the following:

$R_1 = 1$ ohm
$R_2 = 0.5$ ohm
$R_3 = 8$ ohms
$R_4 = 2.5$ ohms
$R_5 = 1.7$ ohms
$R_6 = 34$ ohms
$R_7 = 20$ ohms
$R_8 = 17$ ohms
$L_1 = 25$ pH
$I_{01}$ of J1 $= 30$ $\mu A$
$I_{02}$ of J2 $= 60$ $\mu A$
$I_{03}$ of J3 $= 45$ $\mu A$
$I_{04}$ of J4 $= 60$ $\mu A$
$V_s = 6$ mV

Figure 7:
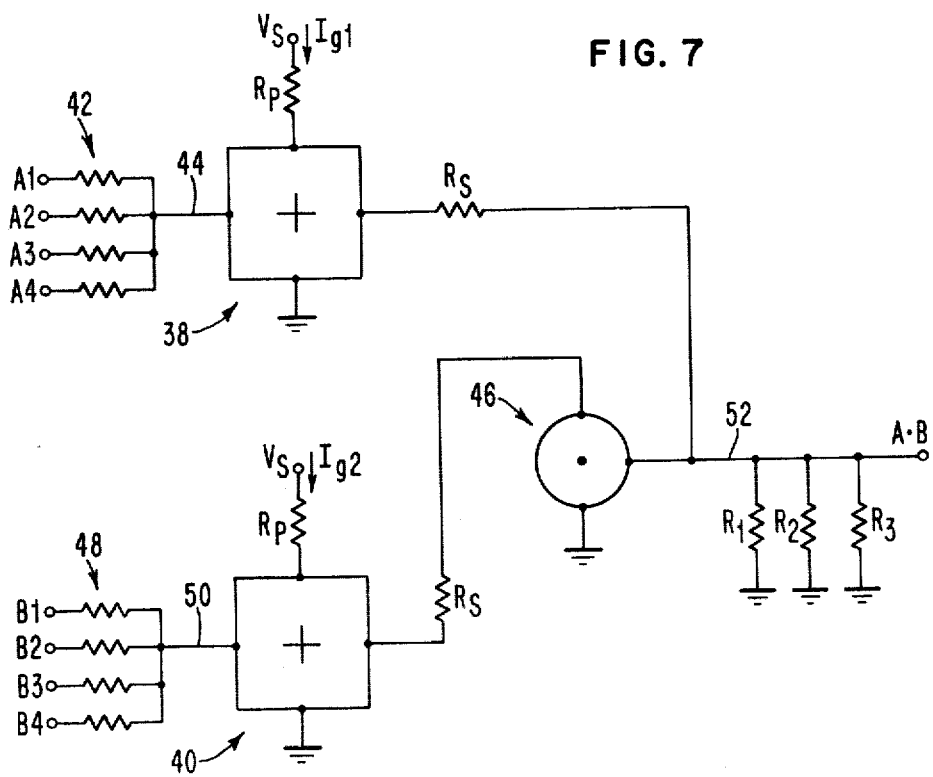
FIG. 7 is a two-input AND circuit with a 4-input DOT-OR at each input to the AND gate, using two isolation gates of the type shown in FIG. 1, or the increased gain circuits of FIG. 6.
Figure 8:
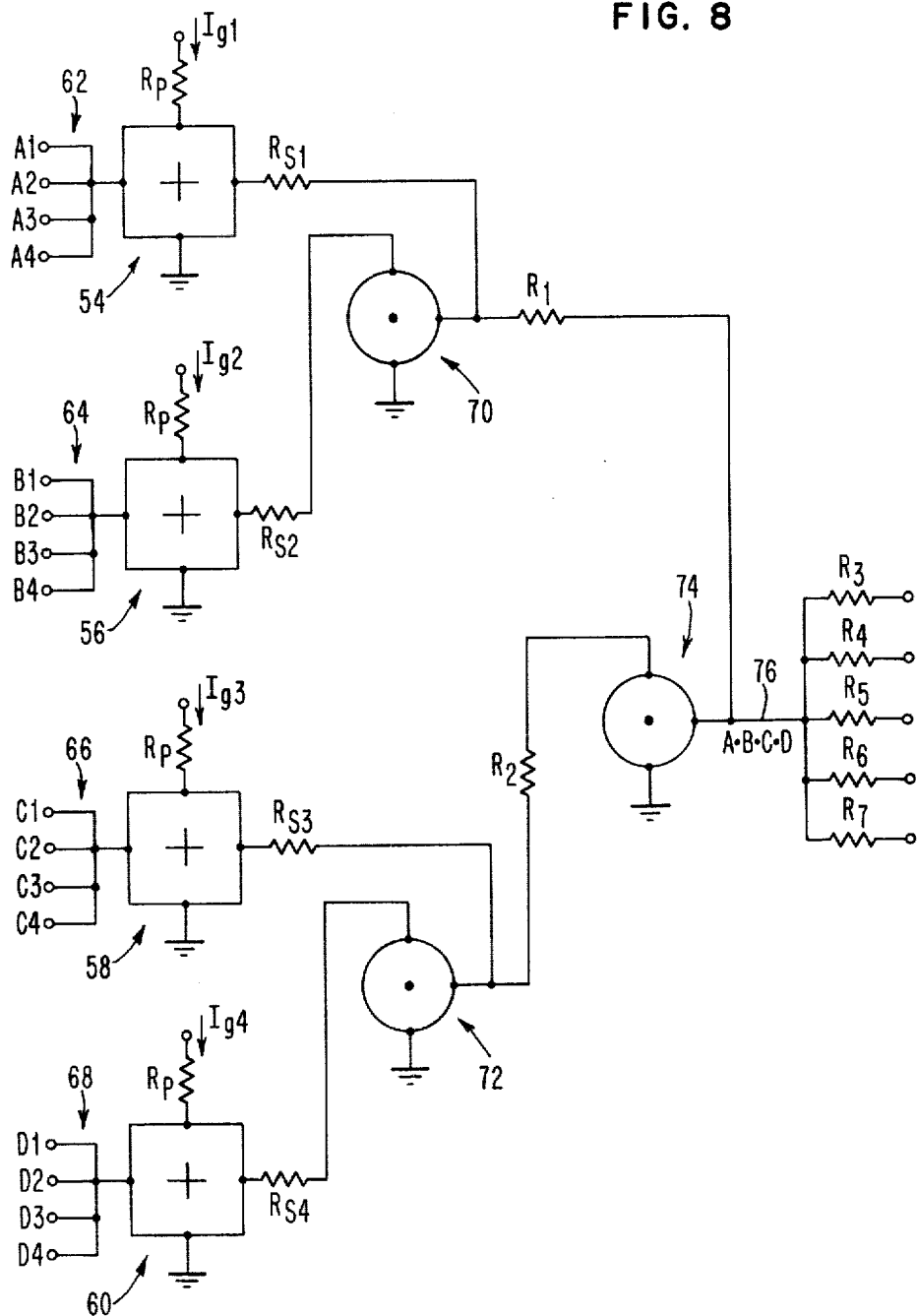
FIG. 8 is a schematic diagram of a direct coupled 4×4 input OR-AND circuit using four of the isolation gates shown in FIG. 1, or the increased gain circuits of FIG. 6.

Logic Circuits (FIGS. 7 and 8)

FIG. 7 shows an AND circuit having two inputs, both of which must be present to have an output. Two isolation gates 38 and 40, which could be identical to the circuit shown in FIG. 1, are used. It should be noted that circuit blocks 38 and 40 could each be comprised of the multiple stage circuits set forth in FIG. 6. Each circuit 38 and 40 is provided with a DOT-OR circuit (42, 48, respectively).

DOT-OR circuit 42 is connected to the input transmission line 44 of isolation gate 38. A plurality of inputs A1, A2, A3, and A4 can be injected into input line 44 for switching isolation gate 38 from a superconductive state to a resistive state. Thus, the isolation gates function as OR gates with inputs A1-A4. In this example, the presence of any of the inputs A1-A4 will switch gate 38. A source (not shown) provides a current $I_{g1}$ through a resistance $R_p$ to isolation gate 38. When both Josephson devices of gate 38 switch to the nonzero voltage state, current $I_{g1}$ will be steered through resistor $R_S$ to the interferometer 46. Interferometer 46 is comprised of Josephson devices and is illustratively the interferometer described in U.S. Pat. No. 4,117,354, and shown in FIG. 4A thereof.

A DOT-OR circuit 48 coupled to the input transmission line 50 of isolation gate 40. A source (not shown) provides a gate current $I_{g2}$ to isolation gate 40. The DOT-OR circuit 48 provides an input (B1, B2, B3, B4) along transmission line 50 to trigger switching of the Josephson devices in isolation gate 40, which will steer gate current $I_{g2}$ through the resistor $R_S$ connected to the output of this isolation gate. This is applied as another input to interferometer 46. Upon the coincidence of outputs from isolation gates 38 and 40, interferometer 46 will switch to provide an output A·B along transmission line 52, where A=A1 or A2, etc. and B=B1 or B2, etc. Resistors $R_1$, $R_2$, and $R_3$ provide parallel fan-out in a manner well known in the art.

FIG. 8 shows a direct coupled 4×4 input OR-AND circuit, which is similar to the AND circuit of FIG. 7, except that it is a four way AND circuit. The circuit is comprised of four isolation gates 54, 56, 58, and 60, such as those shown schematically in FIG. 1 (or the multiple stage circuits of FIG. 6). Each of the isolation gates 54–60 has associated therewith a DOT-OR input 62, 64, 66, and 68, respectively. The DOT-OR circuits 62–68 can receive inputs A1-A4, B1-B4, C1-C4, and D1-D4, respectively.

Current sources (not shown) provide gate currents $I_{g1}$, $I_{g2}$, $I_{g3}$, and $I_{g4}$ to the isolation gates 54–60, respectively. Output resistors $R_{S1}$, $R_{S2}$, $R_{S3}$, and $R_{S4}$ are connected to the outputs of the isolation gates 54–60, respectively, and are located in the transmission lines connected to the interferometers 70 and 72. These interferometers are exemplified by the interferometers shown in FIG. 4A of aforementioned U.S. Pat. No. 4,117,354.

Resistors $R_1$ and $R_2$ are located in the output transmission lines leading from interferometers 70 and 72 to interferometer 74. Interferometer 74 is also exemplified by the interferometers shown in U.S. Pat. No. 4,117,354 and differs from interferometers 70 and 72 only in that the critical current values for its Josephson devices are larger than those for the Josephson devices of interferometers 70 and 72 to accommodate larger injection currents via resistors $R_1$ and $R_2$. Parallel fan-out from the interferometer 74 is provided by the resistances $R_3$-$R_7$ connected to output transmission line 76.

In operation, all inputs A-D, where A=A1, or A2, . . . , etc., B=B1, or B2, . . . , etc., C=C1, or C2, . . . etc., D=D1, or D2, . . . , etc., have to be present in order to provide an output A·B·C·D on transmission line 76. That is, isolation gates 54–60 must be switched to their nonzero voltage states in order to direct the gate currents $I_{g1}$-$I_{g4}$ into the load resistors $R_{S1}$-$R_{S4}$, respectively. These inputs are required in order to switch the interferometers 70 and 72, which then switch interferometer 74 and provide a signal to load resistors $R_3$-$R_7$.

As a representative example of the circuit values in the OR-AND circuit of FIG. 7, a circuit with a delay of 48 pico-seconds and a transition time of 110 pico-seconds was designed without punchthrough. The so-called "punchthrough" speed of the AND gate of FIG. 8 is 110 pico-seconds, which implies that the polarity of the power supply $V_s$ providing the gate currents can be reversed in as little as 110 pico-seconds with proper resetting to zero voltage state of the Josephson devices. In this example, the circuit elements 54–60 are the multiple stage circuits of FIG. 6, having the component values of resistances, etc. given previously. The other component values are $R_{S1} = R_{S2} = R_{S3} = R_{S4} = 4$ ohms, and $R_1 = R_2 = 2.5$ ohms.

What has been shown are improved logic circuits using Josephson devices, and particularly including an improved isolation gate in which large input currents can be used to ensure reliable switching, and in which the input gate current flows through both Josephson devices when both are in the zero voltage state. Thus, enhanced switching margins are provided without the need for an additional gate supply.

The circuits are particularly adapted for providing high gain and can be configured to provide AND and OR circuits having excellent isolation between the input and output.

In the design of the isolation gate, direct coupling of the input signal is used and the Josephson devices therein are separated by resistances. In the design of this gate it is important that the input be injected into the resistor-Josephson device series connection at a point between these two components, and that the output be taken from a point between the Josephson device and resistor in the other series connection. A circuit designed in this manner will provide good isolation and large operational margins without requiring an additional bias source for the second Josephson device. Also, there will be no gate current flow through the load resistance when the isolation gate is in its zero voltage state.

The isolation gate of FIG. 1 functions as an OR circuit when multiple inputs are present. It will be appreciated by those of skill in this art that the resistors $R_1$ and $R_2$ of that gate can be replaced by inductors and that the circuit will still function to provide isolation. The use of inductors instead of resistances is often disadvantageous, since resonances will be introduced, and since the gain of the circuit will then be lower. However, the use of inductors may be advantageous in memory cell applications where both switching and storing functions are required, and in other applications where special circuit characteristics are desired.

It will also be appreciated by those of skill in this art that the Josephson devices of these logic circuits could be any devices which exhibit Josephson effects, such as weak links, point contact devices, thin film tunnel devices, etc.

Those of skill in the art will recognize that other embodiments can be provided using the principles of the present invention, and that logic circuits beyond the AND and OR circuits described herein can be provided.

Having thus described my invention, what I claim as new, and desire to secure by Letters Patent is:

1. A logic circuit comprising Josephson devices, comprising:
   at least two direct coupled isolation gates, each of which provides an output in response to an input of a sufficient magnitude applied thereto and each of which is comprised of Josephson devices,
   each said isolation gate being comprised of a first circuit and a second circuit arranged in a parallel connection, each of said first and second circuits being a series connection of a Josephson device and a resistance, there being an input line directly coupled electrically to said first circuit at a point between said Josephson device and said resistance thereof for injecting an input current signal directly to said first circuit, there being an output line electrically connected to said second circuit at a point between said resistance and said Josephson device of said second circuit for receiving an output current when said Josephson devices in said first and second circuits are switched to their nonzero voltage states, an interferometer electrically connected to the output lines of said isolation gates which can be switched to provide a circuit output therefrom only by the coincidence of output signals from said isolation gates.

2. The logic circuit of claim 1, where said interferometer is comprised of Josephson devices, said interferometer having a nonlinear threshold characteristic.

3. The logic circuit of claim 2, further including a means for applying a gate current to said first and second circuits in said isolation gates, said gate current flowing through said first and second circuits when said Josephson devices are in their zero voltage state, the direction of current flow of said gate current through one of said Josephson devices being opposite to the direction of current flow therethrough of said input current pulse.

4. The logic circuit of claim 3, further including an inductance located in at least one of said first and second circuits in said isolation gates.

5. The logic circuit of claim 3, further including a gain stage electrically connected in tandem to each said isolation gate for providing a current pulse.

6. A logic circuit utilizing Josephson devices, comprising:

at least two direct coupled isolation gates, each of which receives an input current signal along a transmission line directly connected thereto and each of which provides an output signal line along another transmission line connected thereto when an input signal having sufficient magnitude is directly injected to each said isolation gate, each said isolation gate including at least two Josephson devices which isolate the input transmission line thereto and the output transmission line therefrom when said Josephson devices are in their nonzero voltage state, each said isolation gate including two circuits wherein each said circuit includes a Josephson device and a series connected resistor, said two circuits being electrically connected in directly parallel wherein said input transmission line is connected to one of said circuits and said output transmission line is connected to the other of said circuits, means for applying a gate current to each of said isolation gates, said isolation gates sending said gate current to said output transmission lines when said input current signals are injected in order to cause said Josephson devices to be switched to their nonzero voltage states, a DOT-OR circuit connected to each input transmission line for providing any of a plurality of input current signals to said input transmission lines, at least one interferometer for providing the AND function electrically connected to receive the outputs of said isolation gates as injected inputs thereto, and to provide an output only when an input is received simultaneously from each of said isolation gates, said interferometer including Josephson devices which are switched to their nonzero voltage states upon the incidence of injected current signals to said interferometer.

7. The logic circuit of claim 6, further including means coupled to the output of said interferometer for providing parallel fan-out of the output signal from said interferometer.

8. The logic circuit of claim 6, wherein at least two Josephson interferometers are coupled to the output of said isolation gates, said interferometers having different current levels for switching the Josephson devices in said interferometers.

9. A Josephson device isolation gate, comprising:

a first circuit comprised of a series connection of a first resistor and a first Josephson device, a second circuit comprised of a series connection of a second resistor having a non zero resistance and a second Josephson device, said first and second circuits being electrically connected in parallel and having means directly coupled thereto for providing a gate current which divides and flows into said first and second circuits when said first and second Josephson devices are in their zero voltage states, an input electrical line connected to said first circuit at a point between said first resistor and said first Josephson device, an output electrical line directly connected to said second circuit at a point between said second resistor and said second Josephson device, said first and second circuits being arranged to provide a parallel network in which said first resistor is electrically connected to said second Josephson device for directly injecting an input signal and said second resistor is electrically connected to said first Josephson device, said gate current being applied to said network at a point between said first Josephson device and said second resistor, wherein gate current flows through both said first and second Josephson devices when said devices are in their superconducting state, and wherein the directions of current flow of said input current signal and said gate current are opposite to one another in one of said Josephson devices.

10. The circuit of claim 9, wherein said first Josephson device has a maximum Josephson current $I_{01}$ therethrough in the absence of an input signal $I_c$ and said second Josephson device has a maximum Josephson tunnelling current $I_{02}$ in the absence of an input signal $I_c$, said first resistance has a resistance value $R_1$, and said second resistance has a resistance value $R_2$, and wherein the gate current $I_g$ applied to said network includes a component $I_{g1}$ which flows through said first Josephson device and a component $I_{g2}$ which flows through said second Josephson device, there being a load resistance $R_L$ connected to said output electrical line, and wherein $$I_{01}R_1 = I_{02}R_2,$$

$$\frac{R_1}{R_1 + R_2} I_c + I_{g2} > I_{02}, \text{ and}$$

$$\frac{R_2 + R_L}{R_1 + R_2 + R_L} I_g - \frac{R_1}{R_1 + R_2 + R_L} I_c > I_{01}.$$

11. The gate of claim 9, further including an inductance located in at least one of said first and second circuits.

12. The gate of claim 9, further including means for providing a plurality of input signals along said input line, said gate providing an output if any of said plurality of input signals is injected into said gate.

* * * * *